AUTOMATIC TUNING CONTROL FOR R.F. POWER AMPLIFIERS

Filed April 21, 1966

INVENTOR.
DANIEL W. FLETCHER
BY Moody & Gallagher
ATTORNEYS

INVENTOR.
DANIEL W. FLETCHER
BY Moody & Hallacher
ATTORNEYS

INVENTOR.
DANIEL W. FLETCHER
BY Mosely & Gallagher
ATTORNEYS

AUTOMATIC TUNING CONTROL FOR R.F. POWER AMPLIFIERS

Filed April 21, 1966

INVENTOR.
DANIEL W. FLETCHER
BY Hoody & Gallagher
ATTORNEYS

INVENTOR.
DANIEL W. FLETCHER
BY Mody & Halladay
ATTORNEYS

United States Patent Office 3,454,881
Patented July 8, 1969

3,454,881

AUTOMATIC TUNING CONTROL FOR R.F. POWER AMPLIFIERS

Daniel W. Fletcher, Agincourt, Ontario, Canada, assignor to Collins Radio Company, Cedar Rapids, Iowa, a corporation of Iowa Filed Apr. 21, 1966, Ser. No. 544,125
Int. Cl. H04b *1/04, 1/66*
U.S. Cl. 325—177 18 Claims

ABSTRACT OF THE DISCLOSURE

A circuit for automatically turning the power amplifier of a transmitter to the oscillator frequency of said transmitter including coarse tuning and fine tuning means which tune in a very short period of time and are then removed from the transmitter circuit. The tuning is accomplished by following the power output characteristics of a power amplifier in a manner which causes the amplifier output to transmit at its peak output. Once the power amplifier of the transmitter is tuned to the oscillator frequency of said transmitter, transmission is initiated and the tuning means become inactive.

This invention relates generally to a transmitter wherein means are provided for automatically tuning the power amplifier of said transmitter to the oscillator frequency of said transmitter.

In the operation of transmitters and other equipments containing an oscillator, particularly equipment which must be tuned over a large number of frequencies, it is often necessary to select the oscillator frequency and then to tune the power amplifier of the equipment to the oscillator frequency. Such tuning requirements are very common in transmitting apparatus. Each time the frequency is changed the power amplifier must be retuned so that the desired frequency is amplified. In many systems now existing this tuning operation is performed manually or mechanically, through a direct drive between the oscillator tuning components and the power amplifiers, or automatically by electronic means. Most electronic methods are rather complex and increasing difficulty is experienced as frequencies approach the U.H.F. region.

Another instance where automatic tuning of a power amplifier is desired occurs when a smaller transmitter output is fed into a larger power amplifier in order to increase the power output of the smaller transmitter. An example of this is a portable field transmitter which has a low power output and therefore a limited transmission range, used as an exciter to drive a high power amplifier. Upon doing this it becomes necessary to tune the power amplifier to the frequency of the transmitter. An automatic means to accomplish this is essential especially where more than one frequency is to be used.

It is therefore an object of this invention to provide a circuit which automatically tunes the power amplifier of a transmitter to the oscillator frequency of said transmitter in a very short period of time.

It is another object of this invention to provide such a tuning circuit for a power amplifier which is removed from the transmitter circuit.

It is another object of this invention to provide such a tuning circuit in which the tuning is accomplished by following the power output characteristics of a power amplifier in a manner which causes the amplifier output to transmit at its peak output.

It is another object of this invention to provide such a circuit which remains inactive in those instances in which the power amplifier of a transmitter is tuned to the oscillator frequency of said transmitter at the instant transmission is initiated.

Further objects, features, and advantages of the invention will become apparent from the following description and claims when read in view of the accompanying drawings wherein like numbers indicate like parts and in which:

FIGURES 1, 2 and 3 and 4 show various configurations of the invention the operation of each being based on similar principles.

Tuning is accomplished in two tuning steps, coarse tune and fine tune. In the coarse tune step the tuning elements of the power amplifier are driven at relatively high speed through a complete cycle if required. When the tuning of the amplifier generally coincides with the frequency of the R.F. exciting signal, power will appear at the amplifier output. A small portion is rectified and the resulting D.C. voltage supplies the information to end the coarse tune cycle.

Fine tuning information is determined by varying a very small capacitance across the final tank of the power amplifier. If an increase of power is noted each time the capacitance is added to the circuit the tank must be tuned to a frequency above that to be amplified. Conversely if the power falls each time the capacitance is added the tank is tuned to a lower frequency than that to be amplified. As the test capacitance is alternately added and removed from the tank, tuning information is developed by a phase comparison circuit to control the fine tune motor. When the tank approaches resonance the test capacitance will have little effect on the power output, thus indicating a tuned condition to end the fine tune cycle.

Figure 1:
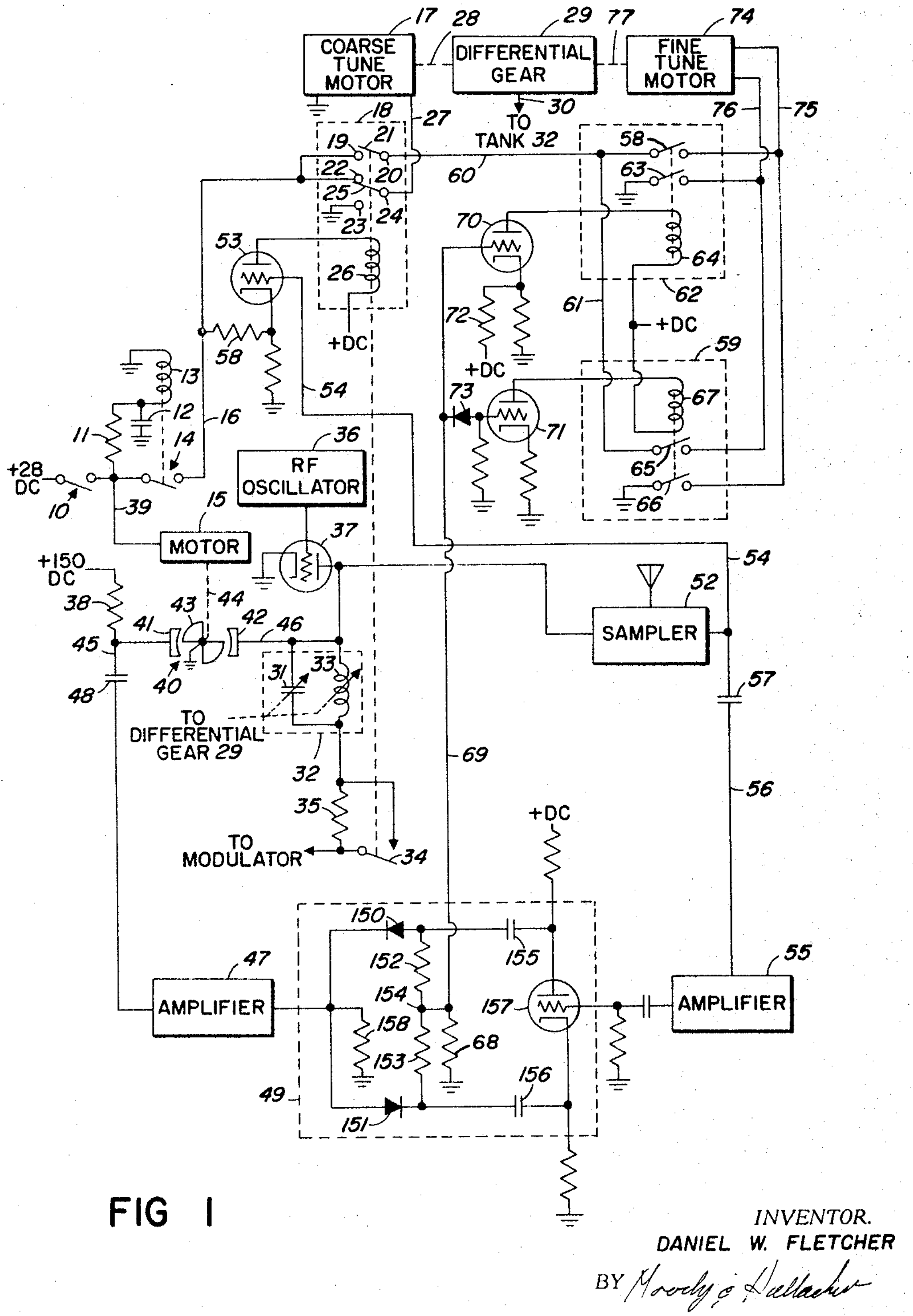
FIGURE 1 shows a first embodiment of the instant invention in which electronic tubes are used.

FIGURE 1 shows a first embodiment of the invention. In order to put the circuit into operation, switch 10 is closed after selecting the desired transmission frequency of the R.F. oscillator and amplifier associated therewith Closing switch 10 applies a D.C. potential to resistor 11, the parallel network consisting of capacitor 12 and relay coil 13, and motor 15. The values of resistor 11, capacitor 12 and coil 13 are such that a small time delay is realized before relay coil 13 is charged sufficiently to pull switch 14 closed.

The closing of switch 14 applies the D.C. input potential to line 16. Line 16 is connected to coarse tune motor 17 through relay 18. Relay 18 is composed of a switch 21 having a permanent contact 20 and an operable contact 19 and also a switch 25 composed of a permanent contact 24 and two operable contacts 22 and 23. At all times either contact 22 or 23 is in contact with switch 25. Actuation of coil 26 changes the position of switches 21 and 25. The circuit arrangement of switch 14 and relay 18 is for two important reasons. First, the delay in closing switch 14 is to allow time for circuit stabilization before the application of voltage to coarse tune motor 17. The importance of this will become evident as the description proceeds. Second, the multiple terminal construction of relay 18 permits the application of dynamic braking to coarse tune motor 17 to prevent overrun when a resonance is reached. The pivotable side 24 of switch 25 is connected to coarse tune motor 17 via line 27. With switch 25 in its normal position as shown in FIGURE 1, the D.C. input voltage is applied to coarse tune motor 17 at the instant switch 14 is closed. Coarse tune motor 17 is thereby caused to rotate. Mechanical linkage 28 connects coarse tune motor 17 to differential gear drive 29 so that actuation of the motor affects rotation of gear drive 29. Differential gear drive 29 is connected by mechanical linkage 30 to adjustable capacitor 31 of tank circuit 32. Consequently as coarse tune motor 17 rotates, the capacitance of adjustable capacitor 31 is changed. This changes the resonant frequency of tank circuit 32 which comprises capacitor 31 and adjustable inductor 33. Variable inductor 33 could be used to tune tank circuit 32 to the desired frequency. Alternatively, both capacitor 31 and inductor 33 can be varied. A third switch 34 is also actuated by relay coil 26. This switch shorts resistor 35 upon actuation of coil 26. Resistor 35 initially protects the power amplifier 37 from receiving the full voltage, until the tuning of the tank is in approximate resonance.

As rotation of coarse tune motor 17 continues the resonant frequency of tank 32 approaches the frequency of R.F. oscillator 36. At this point R.F. will appear at the sampler 52 to generate an output voltage which contains a D.C. component in addition to an aduio component. The D.C. component is applied to voltage sensitive element 53, a triode as shown in FIGURE 1, via Line 54. The audio component is applied to amplifier 55 via line 56. Capacitor 57 prevents the D.C. component from being applied to amplifier 55. The voltage sensitive element 53 is biased off by the resistor 58 which connected to switch 14 through line 16.

When the D.C. output from sampler 52 is sufficient to overcome the bias voltage applied to the cathode of triode 53 through resistor 58 triode 53 conducts and thereby energizes coil 26. Actuation of coil 26 changes the condition of relay switches 21 and 25. Switch 25 is now grounded at terminal 23 and switch 21 is closed at terminal 19. Closing switch 25 causes a ground to be applied to both sides of coarse tune motor 17. This acts as a braking action and causes coarse tune motor 17 to stop within a very short period of time. Acutation of coil 26 also closes switch 34, this short circuits resistor 35 and applies full power to tube 37 as explained hereinabove. This concludes the coarse tune cycle.

Voltage to resistor 38 appears as a potential on plate 41 of capacitor 40. Capacitor 40 is composed of plates 41 and 42 and rotating leaf 43. Motor 15, which is actuated by the closing of switch 10 is mechanically coupled via linkage 44 to leaf 43 of capacitor 40. Leaf 43 therefore rotates between plate 41 and 42 to cause a capacitance fluctuation between plates 41 and 42 and ground. As there is a positive bias on plate 41 a fluctuating voltage will appear on line 45. The fluctuating voltage on line 45 is applied to amplifier 47 through capacitor 48. The output of amplifier 47 is applied to discriminator 49. Discriminator 49 contains a bridge circuit comprised of oppositely poled diodes 150 and 151, identical resistors 152 and 153, load resistor 68, identical capacitors 155 and 156 and phase splitter 157. The output of amplifier 47 is an A.C. wave and therefore diodes 150 and 151 will be alternately biased on in accordance with the polarity of the output of amplifier 47. This portion of the system is to establish a reference wave that may be compared to the phase of the wave generated at the sampler.

Tube 37 is the power amplifier output tube which is being tuned by the tank 32. Plate 42 in conjunction with the rotating capacitor plate 43 forms a varying capacitance in parallel to tuning capacitor 31. The maximum capacitance between plates 42 and 43 is very small compared with the tuning capacitance 31 as the purpose of the rotating capacitor is not to tune the circuit but to act as a test medium to determine whether the tank 32 is tuned above or below the desired frequency to be amplified. For example, let us assume the tank 32 will have been coarse tuned within the pass band. Amplification of the exciting frequency will now be possible but in all probability the tank 32 will not be at peak resonance. There are three states relative to resonance that the tank may be tuned, that is, above resonance, on resonance or below resonance. If the tank is tuned above the exciting frequency, addition of capacity to the circuit will result in greater amplification. Had the tank been tuned below the exciting frequency the addition of capacity will result in less amplification. In the event that the tank was tuned on resonance the small change in capacitance would have little effect on amplification.

Figure 5:
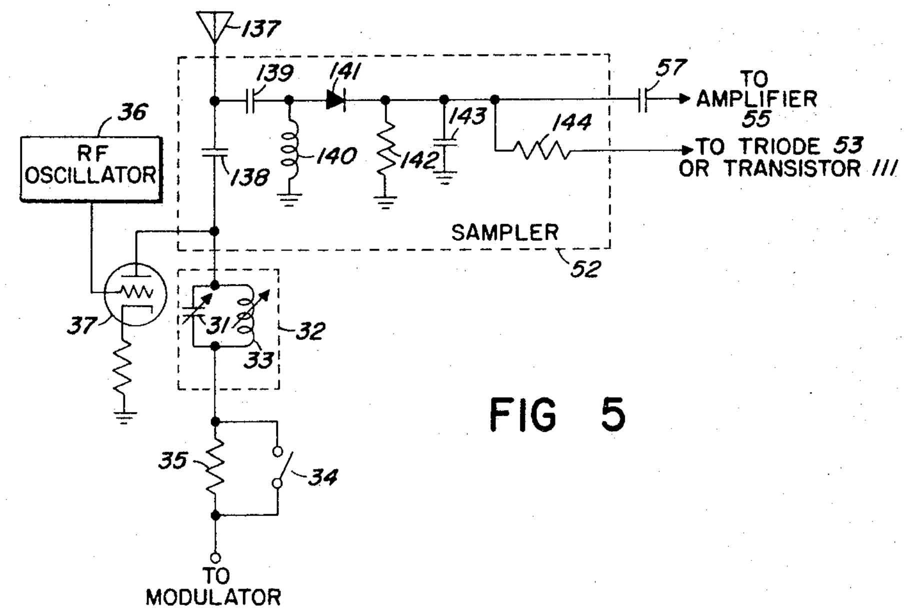
FIGURE 5 shows a schematic diagram of the circuit which samples the power amplifier output.

FIG. 5 shows the sampler circuit which extracts the information represented by power change in the R.F. waveform caused by the rotating capacitor.

The sampler 52 is a simple detector circuit which is lightly coupled to the antenna through a small value capacitor 139. Choke 140 is an R.F. blocking D.C. return. Resistor 142 and capacitor 143 act as D.C. load and R.F. filter. Capacitor 57 blocks D.C. and couples the audio component to amplifier 55. Resistor 144 blocks the loss of audio but feeds through sufficient D.C. to triode 53 or transistor 111 to conduct the coarse tune cycle.

Figure 6:
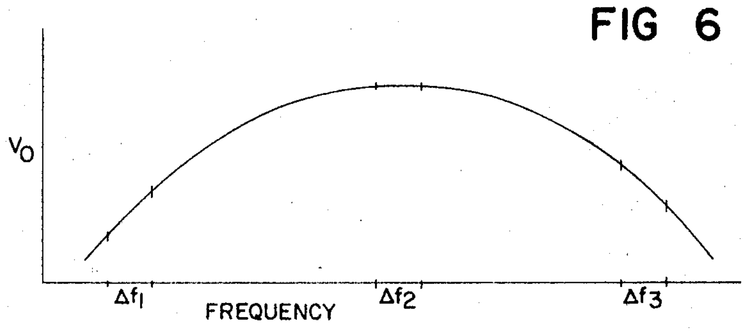
FIGURE 6 shows the power output characteristic as a function of frequency for a power amplifier and is useful in explaining the operation of the invention.

FIG. 6 illustrates the affect on power by the small capacitance change of capacitor 40 over the pass band.

Figure 7:
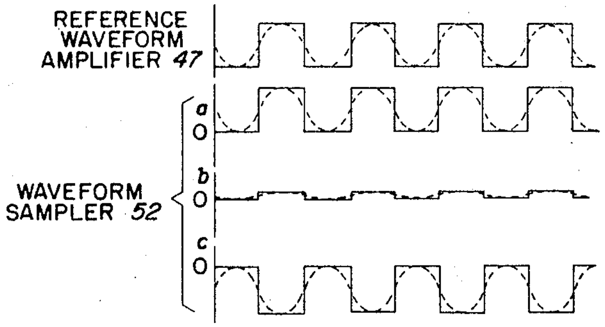
FIGURE 7 shows the output waveforms which are derived from the sampler circuits shown in FIGURES 1, 2, 3, and 4.

FIG. 7 shows the output of the sampler for the three possible states of tuning. The actual waveform will depend on the method of applying the test capacitance. A square wave application resulting in a square wave throughout the system with a sine wave application results in a sine wave throughout the system as shown in solid and broken lines respectively in FIG. 7.

Referring back to FIG. 1, closing of switch 21 occurs at the end of the coarse tune cycle and applies the D.C. input potential to switch contacts 58 and 65 of relays 62 and 59 via lines 60 and 61. Relay 62 consists of a double pole switch having contacts 58 and 63 which is normally open as triode 70 is biased off, and coil 64, the actuation of which will affect the closing of switch contacts 58 and 63 relay 59 is comprised of a double pole switch 65 and 66 which is normally open as triode 71 is biased on, and coil 67, the de-energizing of which will affect the closing of switch contacts 65 and 66. The actuation of relay 62 and 59 requires an output error voltage from discriminator 49. The audio output of sampler 52 is amplified by amplifier 55 and applied to phase splitting tube 157. Phase splitter 157 develops equal and opposite voltage in the cathode and plate circuits. These opposite voltages are compared with the voltages on diodes 150 and 151. The voltages on diodes 150 and 151 are received from amplifier 47 as described hereinabove and therefore are also equal and opposite because of the ground connection through resistor 68. Depending upon the phase relationship of the wave train which is the audio output from sampler 52 and the voltages applied to diodes 150 and 151, one of said diodes will be biased such that it conducts and an error signal will be developed at the junction of resistors 152 and 153. This error signal is applied via line 69 to voltage sensitive elements 70 and 71, in this embodiment triodes. Triode 70 is biased off by a D.C. voltage applied through resistor 72. Triode 71 is biased on due to choice of cathode and grid resistors. It is therefore evident that a positive error signal from discriminator 49 will cause triode 70 to conduct and a negative error signal will stop conduction in triode 71. Diode 73 stops the loss of positive control voltage through triode 71.

Assuming element 70 is conducting due to a positive error signal, coil 64 is energized closing switch contacts 58 and 63 to apply power to the fine tune motor 74 via line 76. These connections cause fine tune motor 74 to rotate in one direction, for example, clockwise. Fine tune motor 74 is coupled to differential gear train 29 via linkage 77. Because of mechanical coupling 30 between gear train 29 and capacitor 31 said capacitor is changed in value by rotation of the fine tune motor 74.

Had the polarity of the error signal been negative, element 71 would have commenced conducting to thereby energize coil 67 and let switch contacts 65 and 66 move to the closed position. The opposite terminals of fine tune motor 74 would then be grounded and energized and the rotation of the fine tune motor would be in the counterclockwise direction and therefore cause rotation of the differential gear train to be in the opposite direction from that when triode 70 conducts.

As the resonant frequency of tank circuit 32 approaches the frequency of R.F. oscillator 36 the effect of the fluctuating capacitance on the tank 32, created by capacitor 40, becomes much less signicant and therefore the audio output component of sampler 52 ceases to exist or is insufficient to create an error signal from discriminator 49.

In the absence of an audio output from sampler 52 no error signal is produced in discriminator 49. For this reason tube 70 or 71 will return to normal state which will cause the opening of relay 62 or 59 and thereby affect a stopping of fine tune motor 74. At this point switch 10 can be opened to remove the automatic tuning circuit from the transmitter. This can be done either manually or automatically.

The output of sampler 52 can best be understood by reference to FIGURES 5, 6, and 7. FIGURE 6 shows the normal output of a power amplifier as the frequency is increased from a value below the resonant frequency of the amplifier to a frequency well above the resonant frequency of the amplifier.

As is apparent from FIGURE 6 $\Delta f_1$ when the frequency of tank circuit 32 is below the frequency of oscillator 36 a slight increase in the resonant frequency of the tank circuit results in a large voltage increase at the output of the amplifier. This phenomenon, in conjunction with the fluctuating capacitance applied by capacitor 40, results in an output wave of the type shown in FIGURE 7*a*, causing an error correction voltage to appear on line 69 which will put the fine tune motor in operation to drive the tank 32 towards resonance.

When the tank circuit is tuned to the frequency of the R.F. oscillator FIG. 6 $\Delta f_2$ the small capacitance change of capacitor 40 being applied at the peak of the response curve, results in a negligible change of output voltage. This wave train is shown in FIGURE 7*b*. With this output wave coming from sampler 52 no error signal is generated in discriminator 49 and therefore fine tune motor 74 is stopped in the manner described hereinabove. When the frequency of tank circuit 32 is above the frequency of the R.F. oscillator $\Delta f_3$, the output wave is similar to that shown in FIGURE 7*c*. This will cause the discriminator to develop a voltage the polarity of which results in the rotation of fine tune motor in a direction which will decrease the frequency of tank circuit 32. This shows the significance of the direction of rotation of fine tune motor 74.

The description of operation set forth above describes the automatic tuning of the power amplifier tank circuit 32 when the resonant frequency of the tank circuit substantially differs from the frequency of the transmitter oscillator at the instant switch 10 is closed.

Assuming that tank 32 is tuned to the oscillator 36 frequency at the instant switch 10 is closed the circuit is prevented from immediately actuating coarse tune motor 17 by switch 14 which remains open because of the time delay created by resistor 11, coil 13 and capacitor 12. Because the tank circuit 32 and oscillator 36 are tuned to the same frequency sampler 52 develops a positive voltage. This voltage is applied to the grid of triode 53 and thereby causes the triode 26 to conduct. The conducting of triode 53 energizes coil 26 which actuates switch 25 so that the arm contacts terminal 23. This grounds coarse tune motor 17 and opens the input line to said motor before switch 14 is closed by coil 13. Fine tune motor 74 is not actuated because no error signal is produced in discriminator 49 when the tank circuit frequency and oscillator frequency are substantially the same. The tank circuit 32 being properly tuned, the tuning circuit which comprises this invention can be taken out of operation, either manually or automatically.

Figure 2:
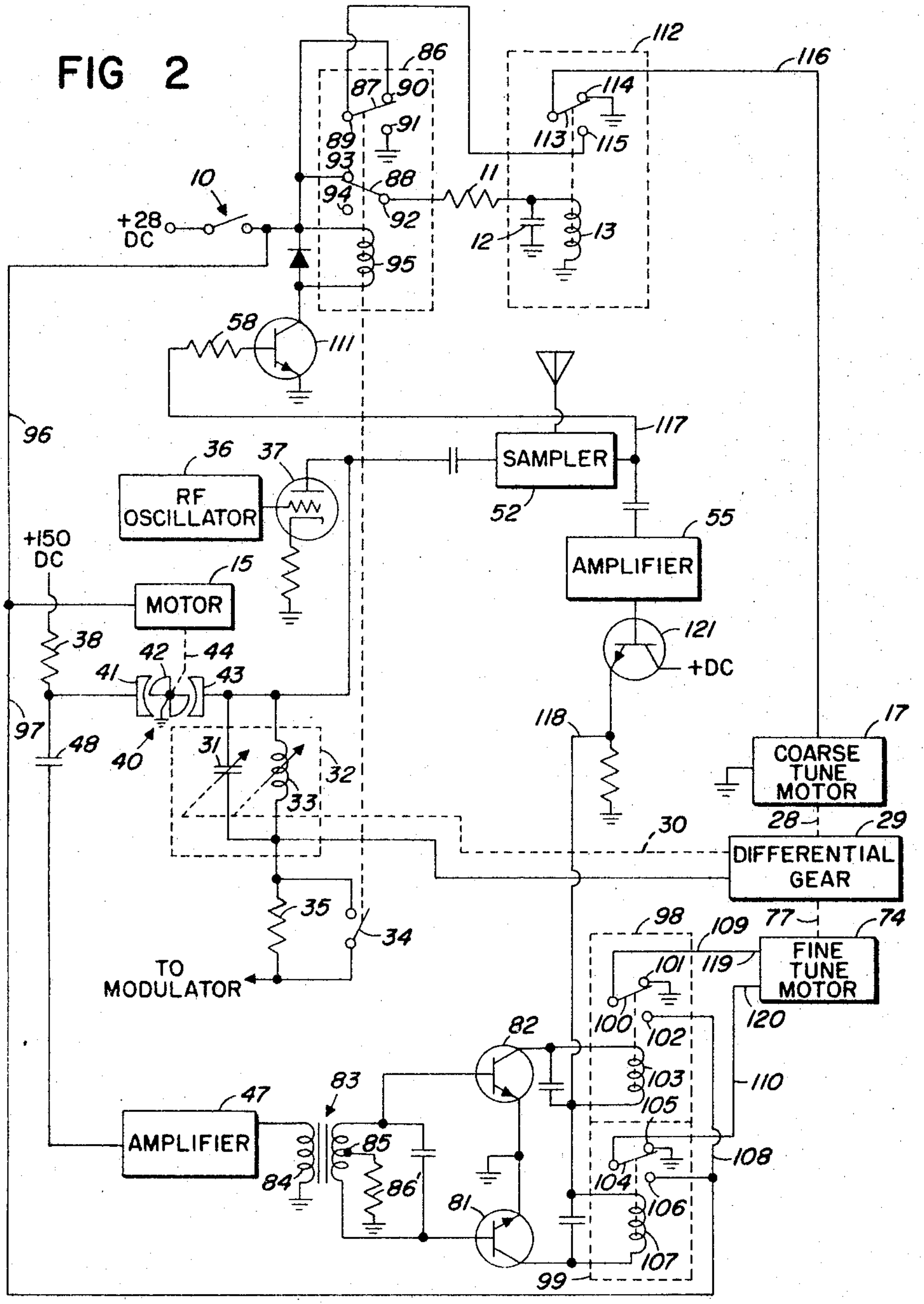
FIGURE 2 shows a second embodiment of the instant invention which is an embodiment which utilizes transistors.

FIGURE 2 shows another embodiment of applicant's invention. In this embodiment the discriminator 49 of FIGURE 1 has been replaced by transistors 81, 82, and 121, transformer 83 and relay coils 103 and 107. In this embodiment closing of switch 10 applies a 28 volt D.C. input to relay 86 containing switches 87 and 88. In the normal position switch 87 is in contact with terminal 90 and switch 88 is in contact with terminal 93. Upon actuation of coil 95 switches 87 and 88 pivot about terminals 89 and 92 respectively to contact terminals 91 and 94 respectively. The input potential is applied through line 96 to motor 15. Another line 97 applies the potential to relays 98 and 99. Relay 98 is composed of a switch 100 which swings from a grounded terminal 101 to an energized terminal 102 upon actuation of coil 103. Relay 99 is composed of a switch 104 which swings from a grounded terminal 105 to an energized terminal 106 upon actuation of coil 107. Terminals 102 and 106 of relays 98 and 99 are connected via lines 108, 97, and 96 to the D.C. input. The pivotable sides of switches 100 and 104 are connected to opposite sides of fine tune motor 74 via lines 109 and 110 respectively. Coil 95 is also connected to switch 10 and therefore a positive voltage is applied to transistor 111. Transistor 111 replaces the vacuum tube 53 of FIGURE 1.

The initial operation of this embodiment is similar to that of the embodiment shown in FIGURE 1. The closing of switch 10 applies a D.C. potential through switch 88 to coil 13 of relay 112. However, because of the time delay the switch does not change its condition for a predetermined period of time. Upon expiration of the delay period arm 113 of relay 112 changes from contact with grounded terminal 114 to contact with terminal 115. This applies the D.C. input to coarse tune motor 17 through switches 87, 113 and line 116 and causes it to rotate to adjust tuning capacitor 31 through differential gear drive 29 and linkage 30. The closing of switch 10 also applies the input voltage to motor 15 and causes it to rotate. As explained hereinabove, this rotation places a fluctuating capacitance between capacitor plates 41 and 43 and ground. When capacitor 31 has tuned tank 32 to a frequency approaching that of oscilltor 36 the output of sampler 52 will contain a D.C. component. This D.C. component is applied to transistor 111 via line 117. As soon as the D.C. component is sufficient the transistor 111 will conduct to energize coil 95.

At this instant switch 87 moves the ground terminal 91 to place a ground on the coarse tune motor for dynamic braking purposes. At the same time switch 88 moves to open the D.C. circuit to relay coil 13. Coil 13 has the delay capacitor across it so release would be too slow to make use of switch 113 to supply the immediate braking action required. The combination of relay 86 and 112 thus gives the delayed start with instant stop action to the coarse tune motor 17.

The audio component of the sampler 52 output is applied through amplifier 55 transistor 121 via line 118 to coils 103 and 107. This voltage will again be a wave train of the type shown in FIGURE 7. Because the secondary 85 of transformer 83 is center grounded through resistor 86′ transistors 81 and 82 will receive equal but opposite audio voltages.

The collectors of transistors 81 and 82 receive their operating voltages in a pulsating form as developed by transistor 121, each collector operating in phase. However as the base excitation is 180° out of phase only one transistor will conduct for a given phase relationship of the waves as supplied by the reference wave amplifier 47 and the sampling wave amplifier 55.

Conduction of transistor 82 will actuate coil 103 which, in turn, will close switch 100 and apply the D.C. input via line 109 to input 119 of fine tune motor 74. This causes rotation of fine tune motor 74 in a clockwise direction. The mechanical coupling of fine tune motor 74 to capacitor 31 through differential gear train 29 will tune tank circuit 32 until the resonant frequency of the tank circuit is the same as the frequency of R.F. oscillator 36. When the tank circuit 32 is tuned to this frequency the output of amplifier 55 will be similar to that shown in FIGURE 7*b*. At this point the output from ampliler 55 will be insignificant and neither transistors 81 or 82 will conduct.

If in the previous example the phase of the wave from amplifier 55 had been reversed, transistor 81 will conduct which will, in turn, close switch 104 and apply the D.C. input to terminal 120 of fine tune motor 74 and thereby cause a counterclockwise rotation of fine tune motor 74.

Tuning of tank circuit 32 continues until its resonant frequency is the same as oscillator 36 frequency. At this point the fluctuating capacitance on plate 43 has an insignificant effect on the power output of tank 32 and no wave train is applied to transistors 81 and 82. In the absence of such a wave train neither transistor can conduct and fine tune motor 74 has no connection to the D.C. input and therefore ceases to rotate. Tank circuit 32 is now tuned to the frequency of oscillator 36 and the tuning circuit which constitutes this invention can be removed from the system. This can be done manually or automatically.

Figure 3:
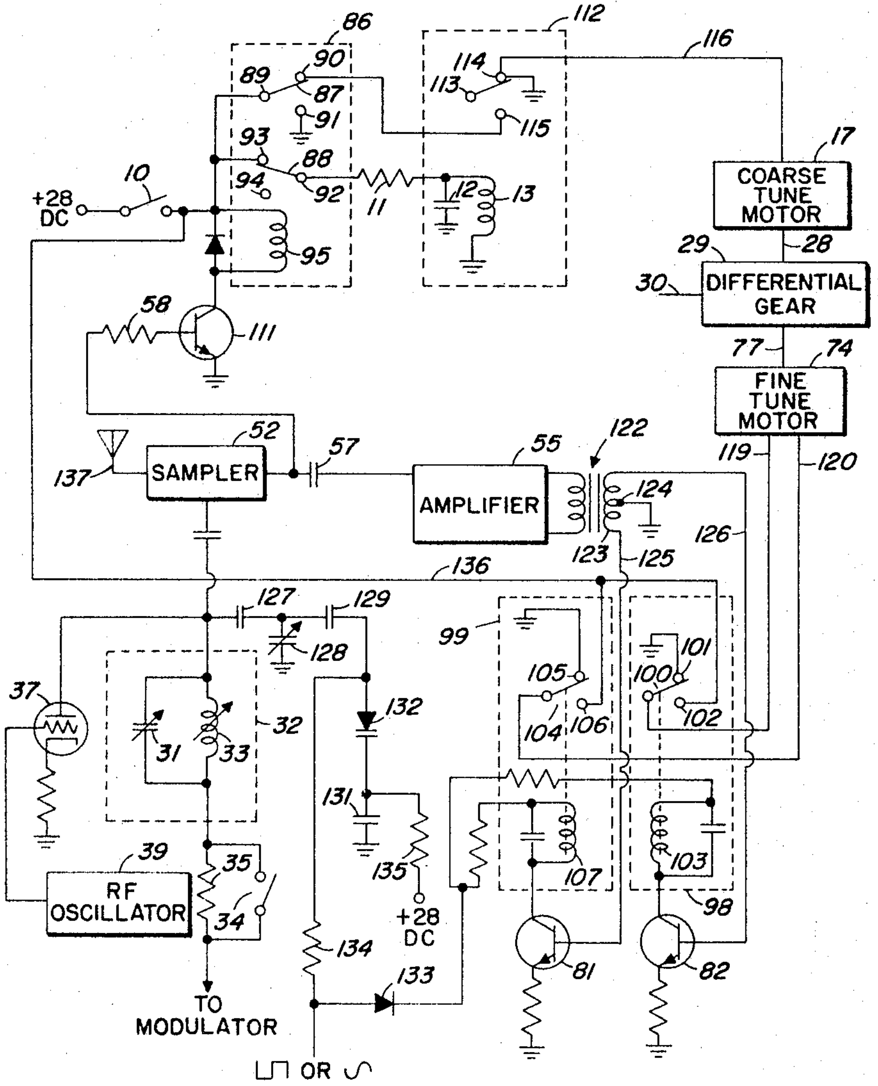
FIGURE 3 shows a simplified embodiment of the instant invention.

The embodiment shown in FIGURE 3 is similar to that of FIGURES 1 and 2, but must have an A.C. signal available to supply the test capacitance to the tank circuit 32 and also act as the reference voltage supplied by amplifier 47. The motor 15 and capacitor 40 are replaced by varactor diode 132.

The output from amplifier 55 is taken from a transformer 122. The secondary 123 of transformer 122 is center grounded at 124. This causes equal but opposite voltages to be applied to the bases of transistors 81 and 82 via leads 125 and 126 respectively. Capacitors 127 and 128 are part of the power amplifier stage. Phase motor 15 and capacitor 40 are no longer needed because of the effects of capacitors 129, 131, diode 132, and resistors 134 and 135.

The coarse tuning has been previously described in FIGURE 2 and is unchanged in this embodiment.

The fine tuning information is established by the effect of adding and removing a small amount of capacity to the power amplifier tank circuit 32. This is done by capacitor 129 and diode 132. If the power amplifier 37 has been coarse tuned to a frequency higher than that which is being received, the addition of capacity will cause an increase in power. This is explained hereinabove in reference to FIGURES 5, 6, and 7.

The capacity increase will occur each time diode 132 increases capacity to a rising voltage in the forward direction. As the feed resistor 134 is connected to a sine or square wave source, the frequency is not significant, capacity will be effectively added and removed from the output tank, at that frequency. Had the coarse tuning mechanism tuned the transmitter lower than the frequency being received a lower power output would be given each time diode 132 switched capacitor 129 into the circuit.

When tank 32 is properly adjusted very little change is produced in the output by the varactor. If it is assumed that the circuit is off tune some small amount a square wave will appear at amplifier 55 which will amplify the wave and present it to the base circuits of transistors 81 and 82 180° out of phase.

The collectors of transistors 81 and 82 are being fed a pulsating D.C. in phase by diode 133.

Either transistor 81 or 82 will be biased on when an error exists in the turning. The transistor which conducts depends on a positive voltage being present at the collector when a positive voltage is at the base. Therefore phase discrimination will exist depending on the tuning error.

The transistor which is conducting draws power through its associated relay 98 or 99 which pulls in the armature to pick up 28 v. at the contact connector to line 136 to operate fine tune motor 74 in a direction to correct the tuning error. When the power amplifier 37 tuning is peaked, due to variable capacitor 31, the effect of sensing capacitor 129 becomes negligible and the A.C. signal disappears at amplifier 55 or becomes so small it cannot turn on transistor 81 or 82 sufficiently to operate either relay 98 or 99, this opens the fine tune motor contact. When the contact is open, the 28 v. D.C. source is disconnected from the fine tune motor 74 and both sides are grounded. This causes a breaking action which stops rotation of the motor.

Figure 4:
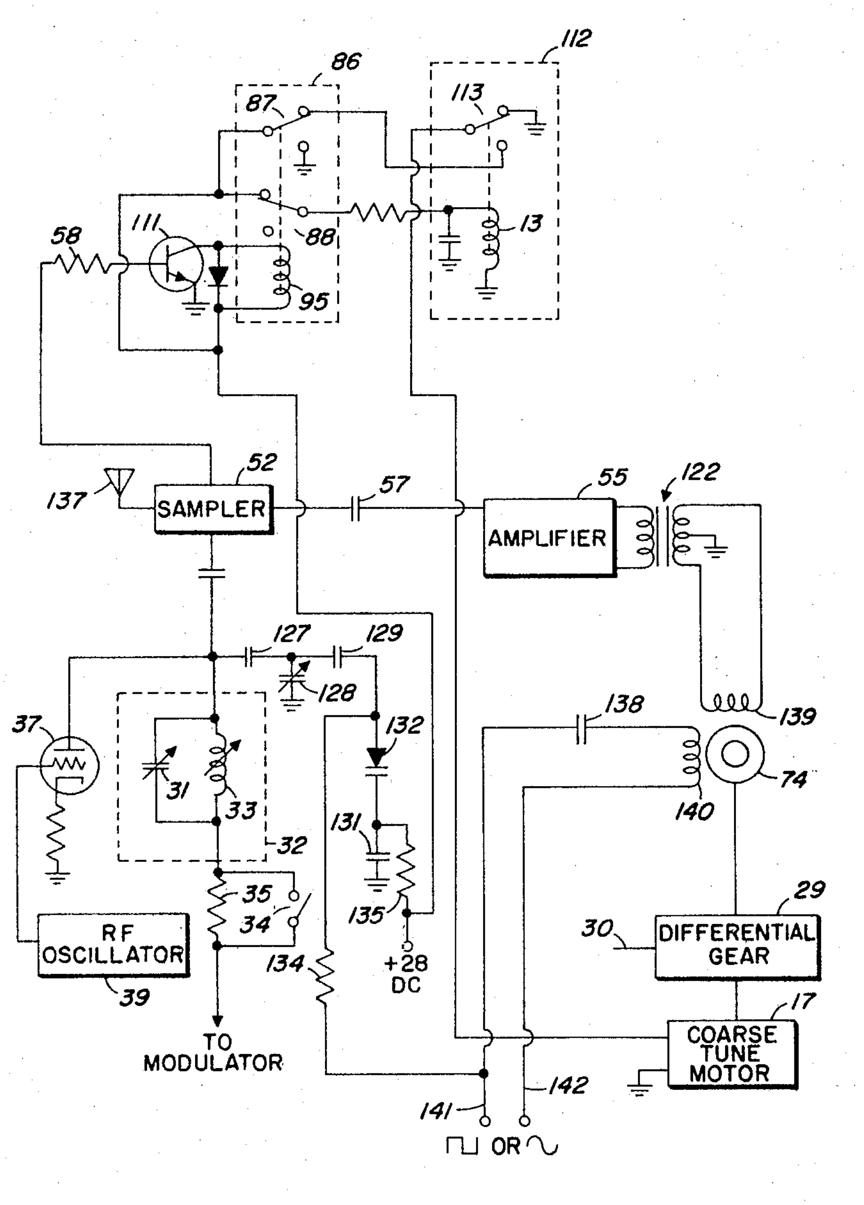
FIGURE 4 shows an embodiment using a servo motor.

The emobdiment shown in FIGURE 4 is similar in principle to that shown in FIGURES 1, 2, and 3. The chief difference is that a two phase servo motor is used to translate the phase information to fine tune mechanical motion.

A.C. power is fed to the circuit via line 141 and 142. The actual frequency wave shape and voltage will influence the choice of components but otherwise is immaterial. The power sensing, coarse tuning and amplification of the error wave remains as above. Transformer 122 supplies power to the control winding 139 of the fine tune motor 74.

The reference winding 140 is connected to the power source by means of line 142, capacitor 138 and line 141. As the reference wave and error wave in the previous designs have appeared either in phase or 180° out of phase it is necessary to shift the phase of one of the waves by 90° to operate the two phase servo motor. This is done by capacitor 138. The phase shift could be accomplished in other locations in the circuit.

It is then assumed that the coarse tune cycle is completed and that the tank circuit 32 is not on exact frequency. A wave as in FIGURE 7*a* will be detected at the sampler 52 and amplified by amplifier 55, and appear at control winding 139. This will put fine tune motor 74 in operation to drive the tuning tank 32 in a direction to reduce the tuning error. When the tuning of the tank 32 is approximately the same as that of the oscillator 39 the wave at the output of the sampler will become insignificant so that amplifier 55 will no longer supply a wave of sufficient power to drive the control winding 139 and the fine tune motor stops.

Had the error wave been in the phase shown at 7*c* the fine tune motor would have revolved in the opposite direction to again correct the fine tuning error.

In all the embodiments shown and described the various relays and switches can be replaced with voltage sensitive elements, or other means, without exceeding the scope of the invention.

Although this invention has been described with respect to particular embodiments thereof, it is not to be so limited, as changes and modifications may be made therein which are within the spirit and scope of the invention as defined by the appended claims.

I claim:

1. An automatic tuning circuit for tuning the frequency of an amplifier to the frequency of an oscillator comprising: frequency tunable circuit means associated with said amplifier, said tunable circuit containing adjustable reactance means for changing the resonant frequency of said tunable circuit, signal sampler means for receiving the output of said amplifier and said frequency tunable circuit, variable capacitance means producing a fluctuating capacitance on each plate thereof, one output of said variable capacitance means being received by said signal sampler to affect the output thereof, coarse tune means actuated by said sampler output and associated with said variable reactance means for tuning the resonant frequency of said frequency tunable circuit toward the frequency of said oscillator, first switching means associated with the output of said sampler to inactuate said coarse tune means as the frequency of said tunable circuit approaches said oscillator frequency, fine tune means actuated by said sampler output and associated with said variable reactance means for tuning the resonant frequency of said frequency tunable circuit to the frequency of said oscillator, second switching means associated with the output of said sampler for actuating said fine tune means to tune the frequency of said tunable circuit to substantially the same frequency as the frequency of said oscillator.

2. The tuning circuit of claim 1 wherein said sampler output contains a D.-C. component when the frequency of said frequency tunable circuit approaches said oscillator frequency, said D.-C. component actuating said first switching means, and wherein said variable capacitance means causes an audio component in said sampler output, said audio component actuating said second switching means as the frequency of said frequency tunable circuit approaches said oscillator frequency, and said audio component becomes negligible when said tunable circuit frequency is substantially the same as said oscillator frequency so that said second switching means is actuated to thereby inactuate said fine tune means.

3. The tuning circuit of claim 2 wherein said variable capacitance means comprises a rotatable leaf situated between capacitor plates.

4. The tuning circuit of claim 2 wherein said variable capacitance means comprises a capacitor and a variable capacitance diode connected in circuit and signal means for alternately causing said diode to effect a capacitance change.

5. The tuning circuit of claim 2 wherein said first switching means is a voltage sensitive electronic element.

6. The tuning circuit of claim 2 including reference signal producing means for receiving the other fluctuating output voltage of said variable capacitor and the audio output of said sampler output to produce an error signal, said error signal actuating said second switching means.

7. The tuning circuit of claim 6 wherein said variable capacitance means comprises a rotatable leaf situated between capacitor plates.

8. The tuning circuit of claim 6 wherein said variable capacitance means comprises a capacitor and a diode connected in circuit and means for alternately causing said diode to be conductive and nonconductive.

9. The circuit of claim 7 wherein said reference signal producing means is a discriminator circuit.

10. The circuit of claim 7 wherein said reference signal producing means comprises oppositely biased electronic elements.

11. The circuit of claim 8 wherein said reference signal producing means comprises oppositely biased electronic elements.

12. The circuit of claim 8 wherein said reference signal producing means comprises a two phase servo motor.

13. An automatic tuning circuit for tuning an amplifier having a tunable circuit to a desired frequency comprising: coarse tune means and fine tune means for successively changing the resonant frequency of said tunable circuit; a direct current voltage source; signal sample means; first switch means connecting said coarse tune means to said D.-C. voltage source; second switch means for connecting said fine tune means to said D.-C. voltage source; voltage sensitive means actuated by said signal sampler for actuating said first switch means; reference signal producing means actuated by said signal sampler means for actuating said second switch means; variable capacitance means for varying the inputs of said sampler means and said reference signal producing means; said sampler means receiving the output of said amplifier, said tunable circuit, and said variable capacitance means so that the output of said sampler actuates said first switch means through said voltage sensitive means to disconnect said coarse tune means from said D.-C. source when the resonant frequency of said tunable circuit approaches said desired frequency; and the output of said sampler actuates said second switch means through said reference signal producing means to connect said fine tune means to said D.-C. source to tune said tunable circuit until the frequency of said tunable circuit is substantially the same as said desired frequency.

14. The circuit of claim 13 wherein said variable capacitor means comprises a rotatable leaf situated between similar plates.

15. The circuit of claim 14 wherein said reference signal producing means is a discriminator circuit.

16. The circuit of claim 14 wherein said reference signal producing means is a pair of oppositely pulsed electronic means.

17. The circuit of claim 13 wherein said variable capacitor means comprises a capacitor and a variable capacitance diode.

18. The circuit of claim 14 wherein said reference signal producing means is a servo motor.

References Cited

UNITED STATES PATENTS 3,277,378 10/1966 Armstrong ---------- 325—187
3,337,823 8/1967 Anderson ----------- 334—26

FOREIGN PATENTS 122,022 10/1946 Australia.

RALPH D. BLAKESLEE, *Primary Examiner.*

A. J. MAYER, *Assistant Examiner.*

U.S. Cl. X.R.

325—187; 334—26